United States Patent
Satake

(10) Patent No.: US 7,208,360 B2
(45) Date of Patent: Apr. 24, 2007

(54) SEMICONDUCTOR DEVICE AND METHOD OF MANUFACTURING THE SAME

(75) Inventor: Hideki Satake, Kanagawa-Ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/385,932

(22) Filed: Mar. 22, 2006

(65) Prior Publication Data

US 2006/0160289 A1 Jul. 20, 2006

Related U.S. Application Data

(62) Division of application No. 10/670,279, filed on Sep. 26, 2003, now abandoned.

(30) Foreign Application Priority Data

Sep. 27, 2002 (JP) ............................. 2002-282441
Sep. 11, 2003 (JP) ............................. 2003-320316

(51) Int. Cl.
*H01L 21/336* (2006.01)
(52) U.S. Cl. ....................................... 438/197
(58) Field of Classification Search ................. 438/197
See application file for complete search history.

(56) References Cited

U.S. PATENT DOCUMENTS

| | | | |
|---|---|---|---|
| 4,141,756 A * | 2/1979 | Chiang et al. ................. | 438/87 |
| 5,750,435 A | 5/1998 | Pan | |
| 5,827,774 A | 10/1998 | Kitajima | |
| 5,885,884 A | 3/1999 | Jan et al. | |
| 6,087,237 A | 7/2000 | Hwang | |
| 6,191,463 B1 | 2/2001 | Mitani et al. | |
| 6,225,151 B1 | 5/2001 | Gardner et al. | |
| 6,242,356 B1 | 6/2001 | Jang et al. | |
| 6,288,433 B1 | 9/2001 | Akram et al. | |
| 6,300,664 B1 | 10/2001 | Kuroi et al. | |

FOREIGN PATENT DOCUMENTS

| | | |
|---|---|---|
| EP | 0 350 845 | 1/1990 |
| EP | 0 706 204 | 4/1996 |
| JP | 9-312393 | 12/1997 |
| JP | 11-97682 | 4/1999 |

OTHER PUBLICATIONS

Yasuoka, A. et al., "The Effects on Metal Oxide Semiconductor Field Effect Transistor Properties of Nitrogen Implantation Into P+ Polysilicon Gate", Japanese Journal of Applied Physics, vol. 36, No. 2, Feb. 1997, pp. 617-622, XP-000735532.

Hsing-Huang Tseng, "Fluorine Diffusion on a Polysilicon Grain Boundary Network in Relation to Boron Penetration From P+ Gates", IEEE Electron Device Letters, vol. 13, No. 1, Jan. 1992, pp. 14-16, XP 000244049.

* cited by examiner

*Primary Examiner*—Long Pham
(74) *Attorney, Agent, or Firm*—Oblon, Spivak, McClelland, Maier & Neustadt, P.C.

(57) ABSTRACT

A semiconductor device is proposed which includes: a semiconductor substrate of a first conductivity type; a channel region formed at a surface of the semiconductor substrate;
source and drain regions of a second conductivity type formed at both sides of the channel region in the semiconductor substrate; an insulating layer covering the channel region; and a gate electrode formed on the insulating layer, the insulating layer containing impurity atoms in such a manner that a concentration thereof is non-uniformly distributed along a surface parallel to the semiconductor substrate.

12 Claims, 8 Drawing Sheets

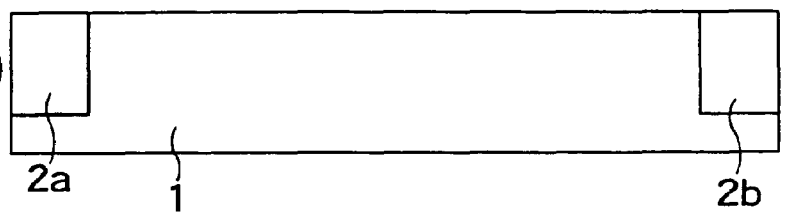
FIG. 2 (a)
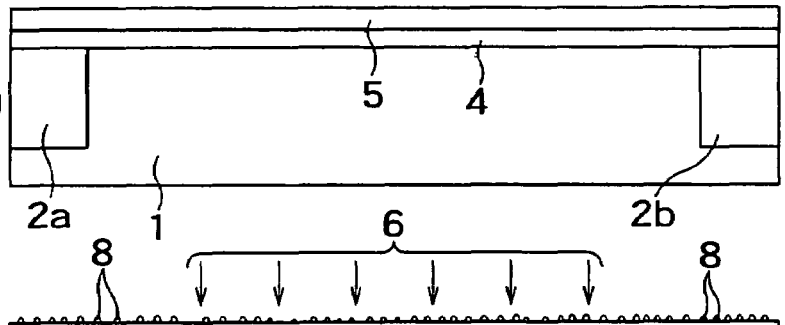
FIG. 2 (b)
FIG. 2 (c)
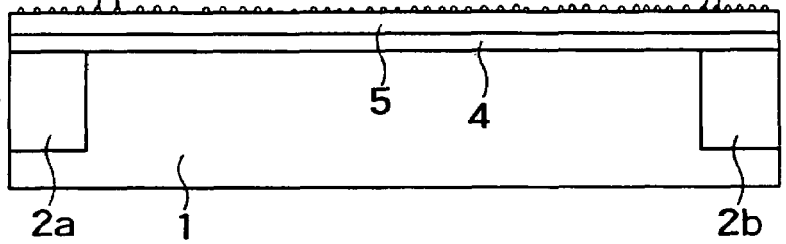
FIG. 2 (d)
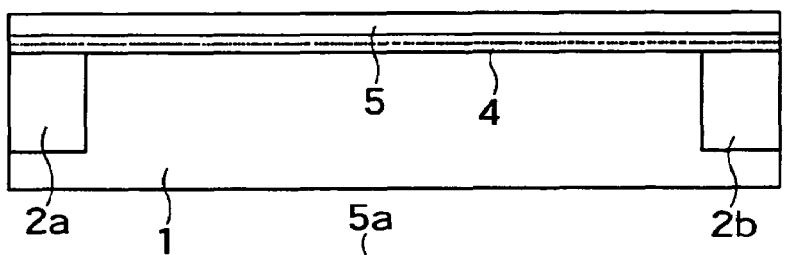
FIG. 2 (e)
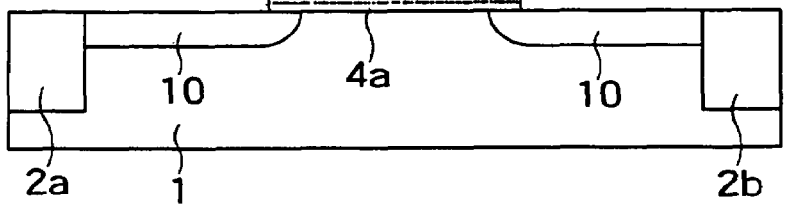
FIG. 2 (f)
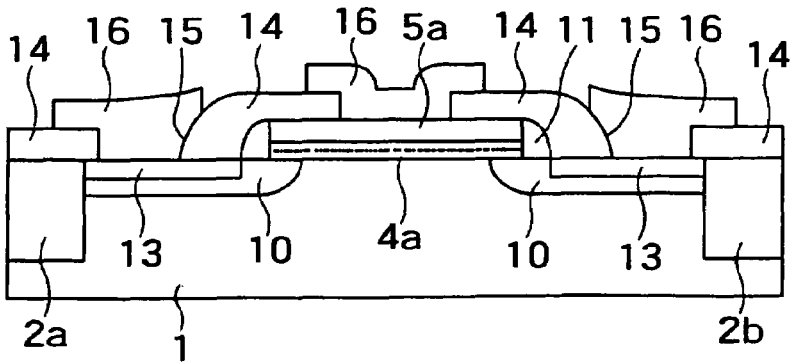

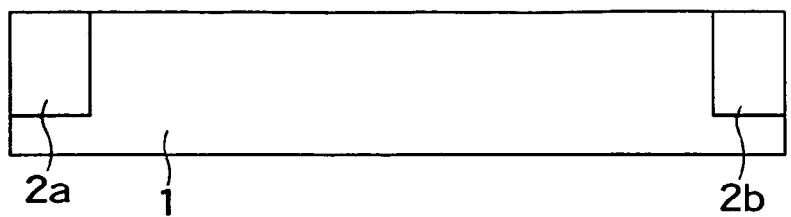
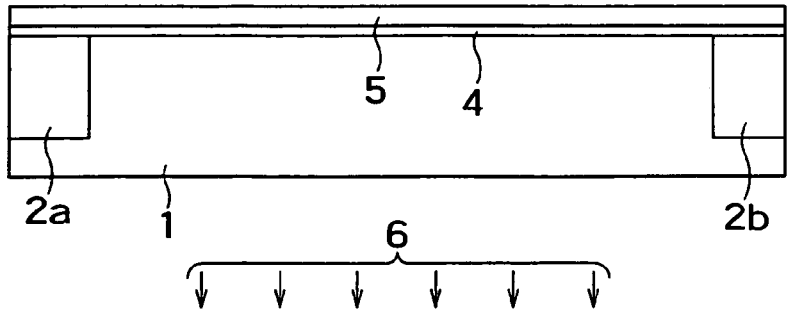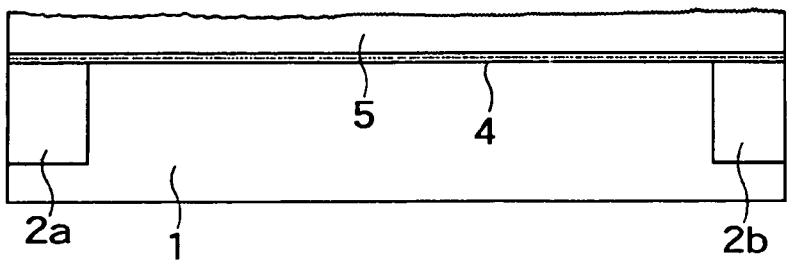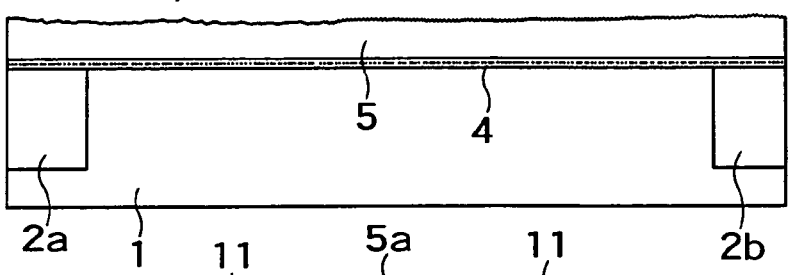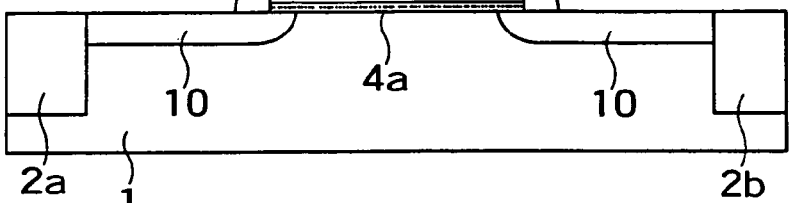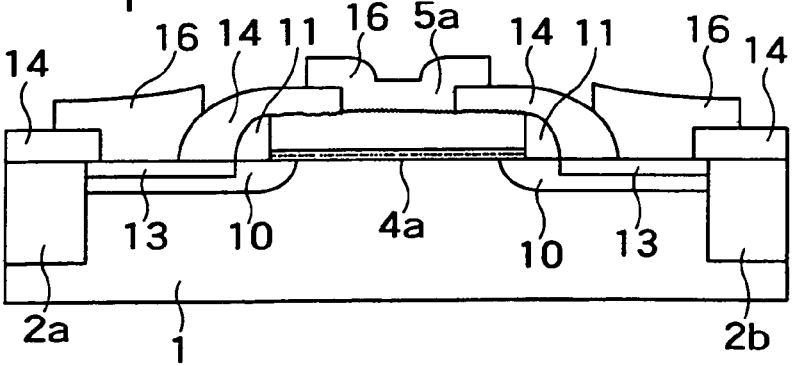

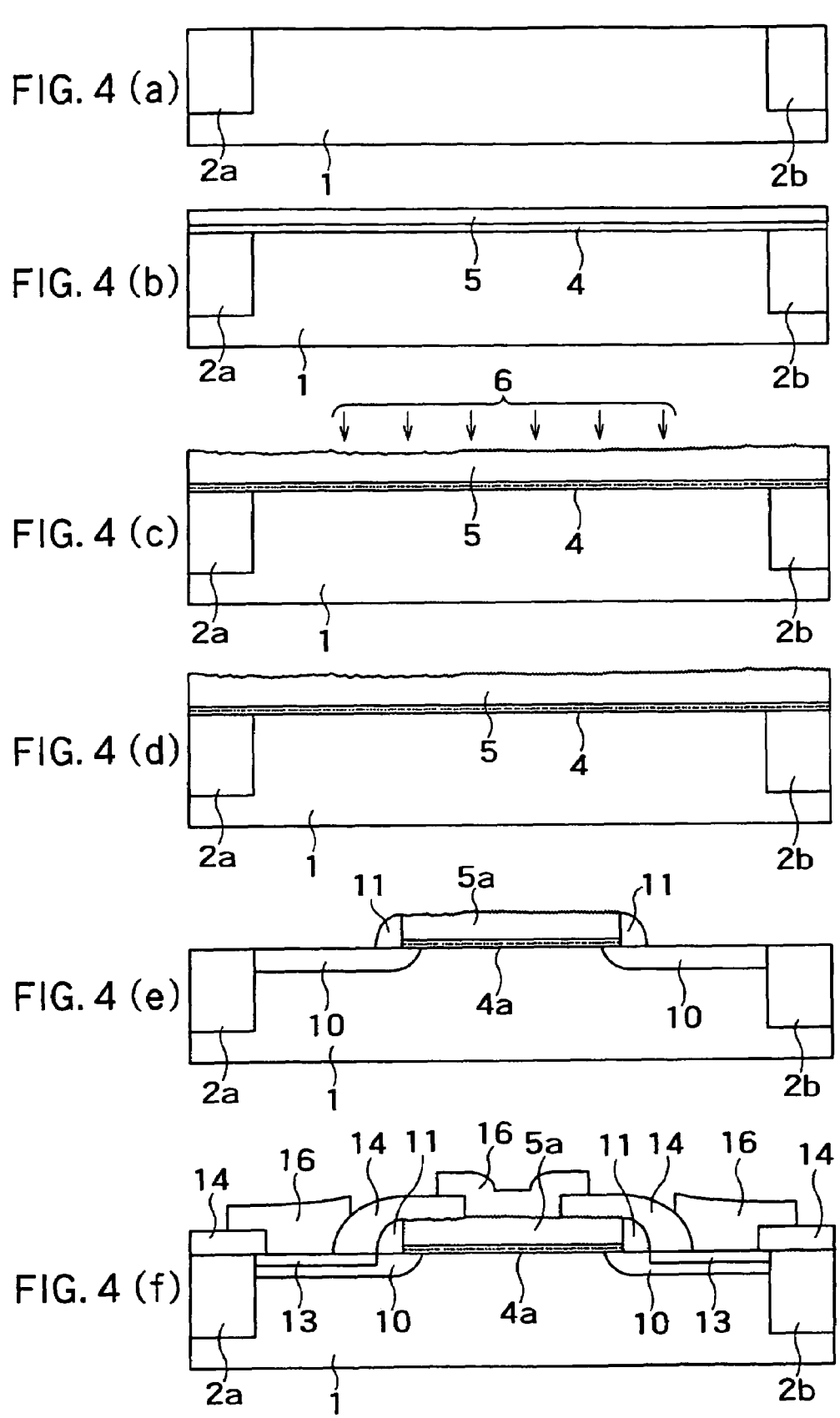

SEMICONDUCTOR DEVICE AND METHOD OF MANUFACTURING THE SAME

CROSS-REFERENCE TO RELATED APPLICATIONS

This application is a division of U.S. application Ser. No. 10/670,279 filed Sep. 26, 2003 now abandoned and further is based upon and claims the benefit of priority from prior Japanese Patent Applications No. 2002-282441, filed on Sep. 27, 2002 and No. 2003-320316, filed on Sep. 11, 2003, the entire contents of which are incorporated herein by reference.

BACKGROUND OF THE INVENTION

1. Field of the Invention

The present invention relates to a semiconductor device and a method of manufacturing the same. In particular, the present invention relates to a MOS (metal-oxide-semiconductor) semiconductor device, in which the reliability of thin dielectric films, such as gate oxide layers, is increased, and a method of manufacturing the same.

2. Related Art

Recently, as the performance and speed of LSIs (large scaled integrated circuits) are improved, the miniaturization of MOS transistors has advanced. Accordingly, there have also been rapid advances in decreasing the thickness of gate dielectric films of MOS transistors. As a result, there is a demand for a technique for uniformly forming an ultra-thin silicon dielectric film uniformly with a high reliability. It was recently reported that a device first suffering soft breakdown (SBD) and then reaching hard breakdown (HBD), as a dielectric breakdown mode, has a longer lifetime than a device first suffering hard breakdown (K. Okada et al., Tech Dig. Symp. on VLST Technology, p. 57 (2000); K. Okada et al., "A Concept of Gate Oxide Lifetime Limited by "B-mode" Stress Induced Leakage Currents in Direct Tunneling Regime", Symposium on VLSI Technology Digest of Technical Paper, 1999, PP. 57–58). However, since whether a dielectric breakdown of a gate dielectric film is a soft breakdown or a hard breakdown is dependent on random chance, it has been very difficult to selectively cause only soft breakdown. A device suffering soft breakdown has a significantly longer lifetime (a period from the time a device suffers soft breakdown to the time it reaches hard breakdown) when it is used under a low voltage stress than when it is used under a high voltage stress. This is shown in FIG. 8, in which the horizontal axis represents stress voltage (−V) applied to the gate of a device, and the vertical axis represents lifetime (S). That is, $T_{HB}$ shows the period (lifetime) from the time a device suffers soft breakdown to the time it reaches hard breakdown. As can be understood from FIG. 8, the gradient of the graph changes when the stress voltage is less than about 3.2 V. This means that when the stress voltage is under about 3.2 V, the lifetime is extended.

As described above, a dielectric breakdown of a gate dielectric film is believed that once a soft breakdown occurs then a hard breakdown occurs. However, in general, there has been a problem in that technically it is not possible to control the time from the point a soft breakdown occurs to the point a hard breakdown occurs.

SUMMARY OF THE INVENTION

The present invention is proposed in consideration of the above-described circumstances. The characteristic feature of the present invention lies in that although defective portions are caused by non-uniform implantation of an impurity to a gate dielectric film, which implantation forming portions electrically weak against stress, it is possible to maintain the dielectric breakdown mode of the gate dielectric film at the soft breakdown level. It is the object of the present invention to provide a semiconductor device having a structure capable of lengthening the hard breakdown lifetime of its gate dielectric film, this semiconductor device being easy to manufacture at a low cost, and having a high reliability, and a method of manufacturing such a semiconductor device.

The embodiment of the present invention is directed to a semiconductor device including: a semiconductor substrate of a first conductivity type; a channel region formed at a surface of the semiconductor substrate; source and drain regions of a second conductivity type formed at both sides of the channel region in the semiconductor substrate; an insulating layer covering the channel region; and a gate electrode formed on the insulating layer, the insulating layer containing impurity atoms in such a manner that a concentration thereof is non-uniformly distributed along a surface parallel to the semiconductor substrate.

The embodiment of the present invention is further directed to a method of manufacturing a semiconductor device including: forming an insulating layer on a semiconductor substrate of a first conductivity type; forming a conductive layer on the insulating layer; forming on the conductive layer a spotted layer including minute spots containing a resistive material resisting against ion implantation; non-uniformly implanting impurity ions to the conductive layer via the spotted layer containing the resistive material; and diffusing the impurity ions in the conductive layer into the insulating layer.

The embodiment of the present invention is still further directed to a method of manufacturing a semiconductor substrate comprising: forming an insulating layer on a semiconductor substrate of a first conductivity type; forming a conductive layer on the insulating layer; performing implantation of impurity ions several times so that an impurity concentration of the conductive layer becomes non-uniform due to implantation fluctuations; and diffusing the impurity ions in the conductive layer into the insulating layer.

The embodiment of the present invention is further directed to a method of manufacturing a semiconductor substrate comprising: forming an insulating layer on a semiconductor substrate of a first conductivity type; forming a conductive layer on the insulating layer; forming minute projections and depression on a surface of the conductive layer by etching the conductive layer; performing ion implantation of impurity ions on the conductive layer having the projections and depressions on the surface; and diffusing the impurity ions in the conductive layer into the insulating layer.

BRIEF DESCRIPTION OF THE DRAWINGS

FIGS. 2(a) to 2(f) are sectional views showing the steps of a method of manufacturing a MOS type transistor according to the second embodiment of the present invention.

FIGS. 3(a) to 3(f) are sectional views showing the steps of a method of manufacturing a MOS type transistor according to the third embodiment of the present invention.

FIGS. 4(a) to 4(f) are sectional views showing the steps of a method of manufacturing a MOS type transistor according to the fourth embodiment of the present invention.

DESCRIPTION OF THE EMBODIMENTS

Hereinafter, the embodiments of the present invention will be described with reference to the accompanying drawings.

First Embodiment

Figure 1:
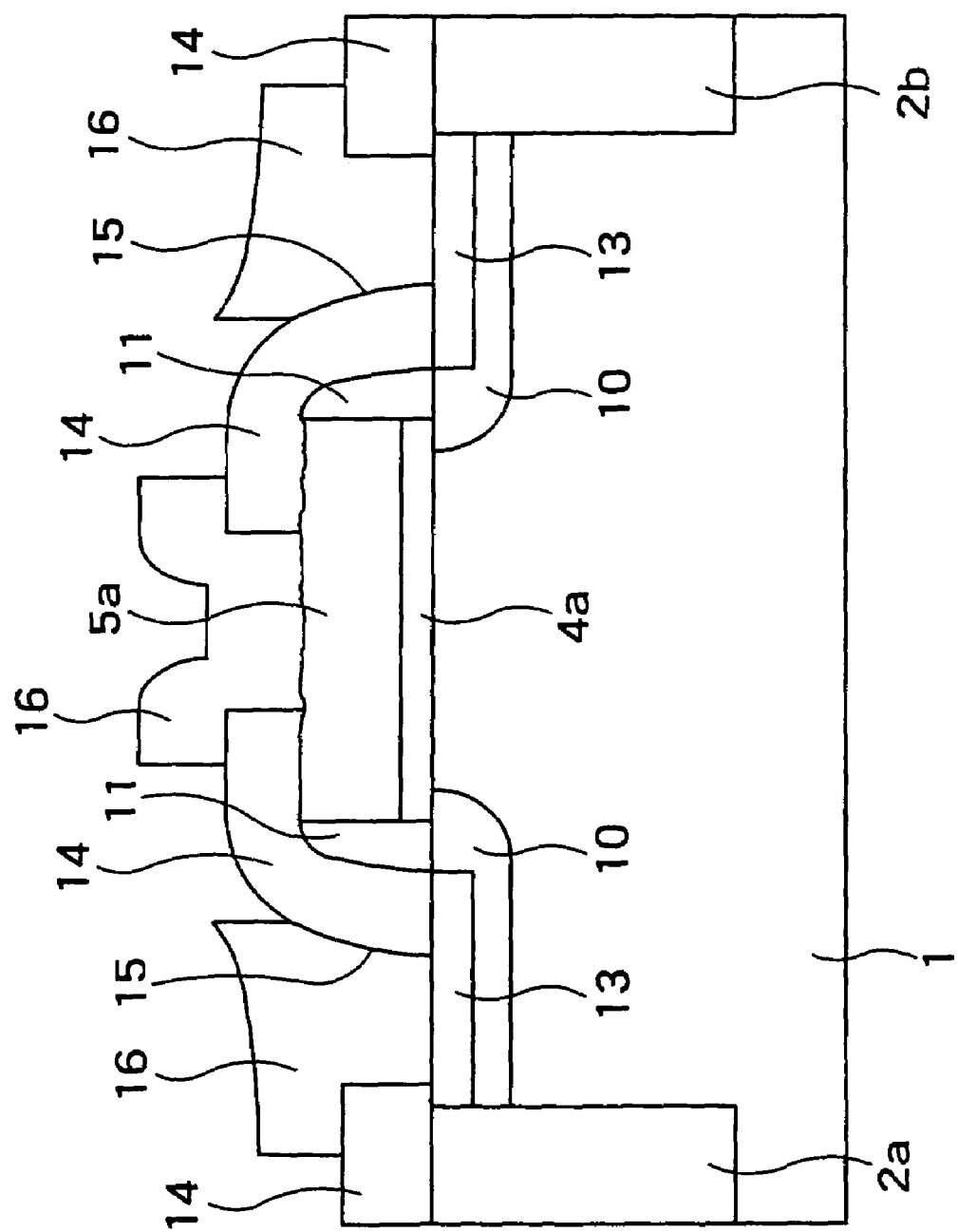
FIG. 1 is a sectional view showing the structure of a MOS type transistor according to the first embodiment of the present invention.
Figure 9:
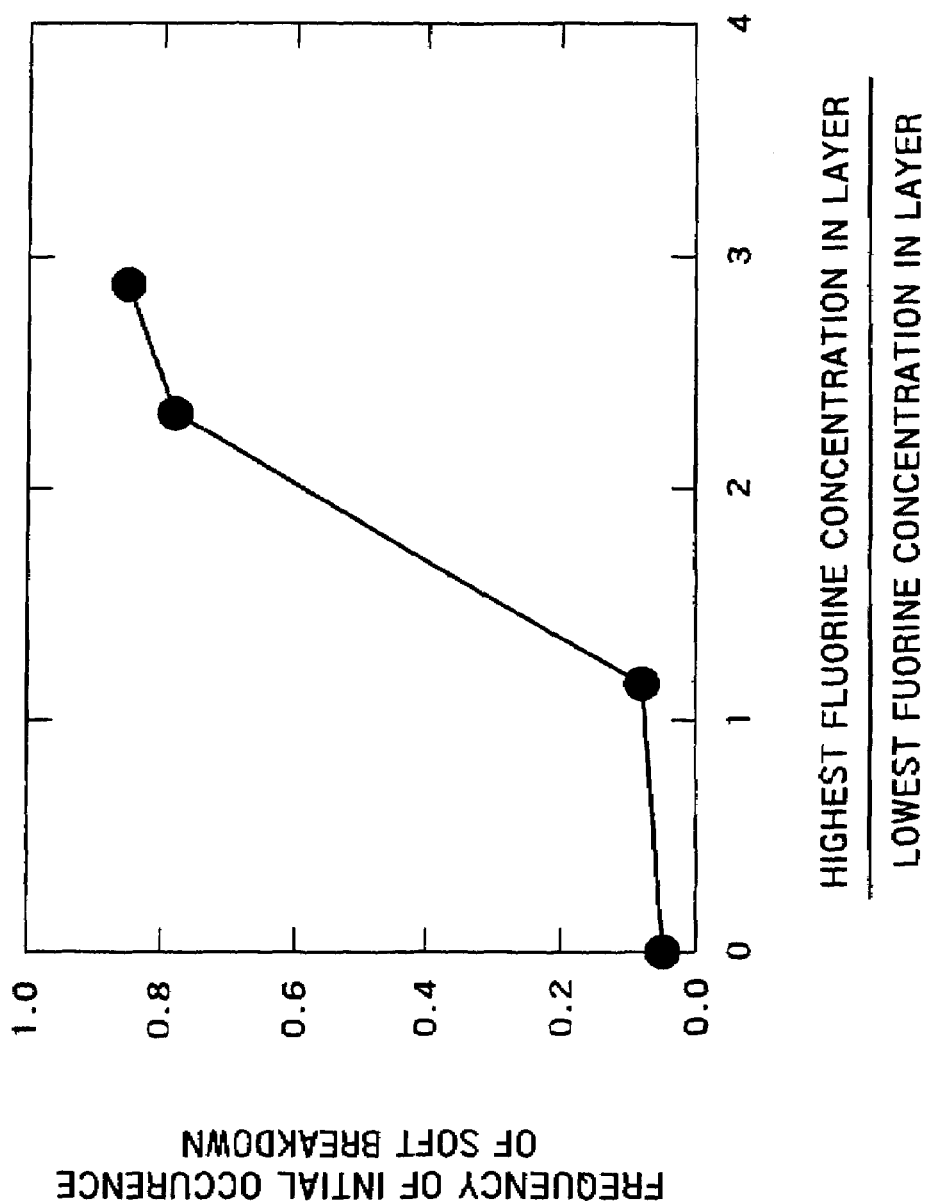
FIG. 9 shows the relationship between the highest fluorine concentration in layer divided by the lowest fluorine concentration in layer and the frequency initial occurrence of soft breakdown.

FIG. 1 shows a cross-sectional structure of a MOS type semiconductor device according to the first embodiment of the present invention. The MOS type semiconductor device of this embodiment includes, for example, an n-type silicon substrate 1 having a surface orientation (100), and a specific resistance of 4–6 $\Omega$cm, and device isolation regions 2a and 2b, which are about 0.6 μm in depth, formed in the silicon substrate 1. A gate oxide layer 4a having a thickness of, e.g., 2–8 nm, is formed on the silicon substrate 1 by thermal oxidation, and a polycrystalline silicon layer 5a serving as a gate electrode is formed on the gate oxide layer 4a, the polycrystalline silicon layer 5a having a thickness of 200 nm. The gate electrode contains, e.g., $3-5 \times 10^{20}$ cm$^{-3}$ of phosphorous serving as a dopant to decrease the resistance of the gate electrode. The gate insulating layer 4a contains, e.g., $1 \times 10^{19} - 1 \times 10^{20}$ cm$^{-3}$ of fluorine atoms serving as impurities, the fluorine atoms being distributed in the gate insulating layer such that the highest fluorine concentration is more than two times as large as the lowest fluorine concentration in a parallel cross section to the surface of silicon substrate. The present inventor has understood from his experience that as shown in FIG. 9, when the highest fluorine concentration is more than two times as large as the lowest, the dielectric breakdown of the gate dielectric film is maintained to be within the range of soft breakdown. Impurity layers 10 serving as a pair of source and drain diffusion layers are located at both sides of the gate electrode in the silicon substrate 1, on each of which a titanium silicide layer 13 is formed. A gate side wall 11 of silicon nitride is formed around the gate electrode. A silicon oxide layer 14 is deposited on the entire device, through which contact holes 15 are formed. Aluminum electrodes 16 connecting to the gate electrode and the source and drain diffusion layers are formed via the contact holes 15.

As described above, according to the this embodiment, the gate oxide layer contains, e.g., $1 \times 10^{19} - 1 \times 10^{20}$ cm$^{-3}$ of fluorine atoms serving as impurities, the fluorine atoms being distributed in the gate oxide layer such that the highest fluorine concentration is more than two times as large as the lowest fluorine concentration in a parallel cross section to the surface of silicon substrate 1. This enables the dielectric breakdown of the gate dielectric film to be maintained in the soft breakdown mode, and also enables the lengthening of the hard breakdown lifetime of the gate dielectric film.

Although $1 \times 10^{19} - 1 \times 10^{20}$ cm$^{-3}$ of fluorine atoms are contained as impurities in the gate oxide layer of this embodiment, the impurity material is not limited to fluorine, but any of B, C, N, F, P, S, Cl, As, Se, and Br atoms can be used. This can be said for the other embodiments described below. The present inventor has known from experiments that such atoms can be used.

Second Embodiment

Next, the second embodiment of the present invention will be described below with reference to FIGS. 2(a)–2(f) and 7. The second embodiment is a method of manufacturing a semiconductor device. FIGS. 2(a)–2(f) show the manufacturing steps thereof.

First, an n-type silicon substrate 1 having, e.g., a surface orientation (100) and a specific resistance of 4–6 $\Omega$cm is prepared. Device isolation regions 2a and 2b of about 0.6 μm in depth are formed in the n-type silicon substrate near its surface by a normal shallow trench isolation (STI) method (FIG. 2(a)).

Next, the workpiece is subjected to a mixed gas containing oxygen gas and hydrogen gas at a temperature of, e.g., 750° C. in order to form an oxide layer 4 of, e.g., about 3–8 nm in thickness. A polycrystalline silicon layer 5 having a thickness of 200 nm, which will serve as a gate electrode, is formed on the oxide layer 4 (FIG. 2(b)).

Thereafter, a resist 8 is applied to the entire surface, and then is removed by the resist etch back method, in which the workpiece is soaked in a chemical solution containing 3 kg of hydrogen peroxide solution and 5 kg of sulfuric acid for about 10 minutes. As a result, the resist partially remains on the upper surface of the polycrystalline silicon layer 5, the remaining resist having a height of 100 nm. Subsequently, the dose amount $1 \times 10^{14}$ cm$^{-2}$ of fluorine ions 6 are injected at an acceleration voltage of, e.g., 10 keV, so that the polycrystalline silicon layer 5 contains fluorine atoms (FIG. 2(c)).

Then, the workpeice is subjected to nitride gas at a temperature of, e.g., 1,000° C. for 10 seconds, so that the fluorine atoms in the polycrystalline silicon layer 5 are diffused into the oxide layer 4. Since the fluorine atoms have not been evenly injected to the polycrystalline silicon layer 5, the fluorine concentration distribution in a surface of the gate oxide layer 4 that is parallel to the surface of the silicon substrate 1 is irregular, as indicated by the dotted line (FIG. 2(d)). It is possible that in the step shown in FIG. 2(c), the implantation of fluorine ions can be performed several times, so that the concentration distribution becomes uneven due to the fluctuations during the ion implantation. Since the resist is partially left in the step shown in FIG. 2(c), when ions are implanted to such a coarse surface, the profile of the implanted atoms fluctuates, resulting in that the profile of the atoms implanted into the gate dielectric film through the thermal treatment, which is performed later, also fluctuates. Accordingly, the influence of the atoms on the layer properties becomes irregular.

Figure 5:
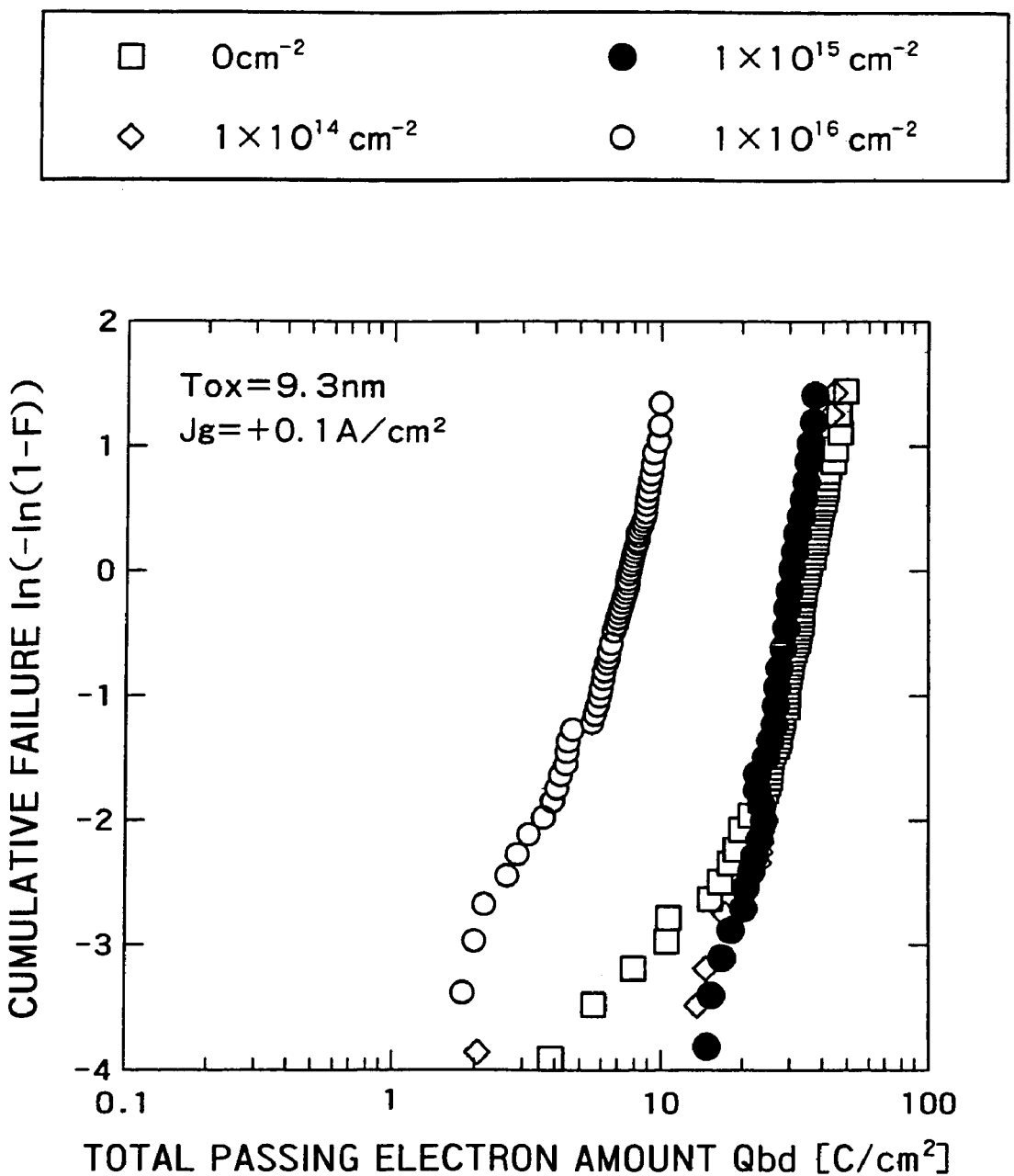
FIG. 5 shows the cumulative fraction defective of the total amount (Qbd) of electrons passing through the gate oxide layer before a dielectric breakdown occurs, with the dose amount of fluorine being changed.

FIG. 5 shows the change in distribution of Qbd the total amount of electrons passing through the gate oxide layer before a dielectric breakdown occurs, when the dose amount of fluorine is changed. In FIG. 5, the abscissa axis shows total passing electron amount, Qbd, and the ordinate axis cumulative failure ln(−ln(1−F)). As can be understood from FIG. 5, when the dose amount of fluorine exceeds $1 \times 10^{15}$ cm$^{-2}$, the lifetime of devices is abruptly shortened. That is, in a region containing an excessive amount of fluorine atoms, the deterioration of the gate oxide layer is accelerated. It has been verified that the fluorine atom concentration in the gate oxide layer when the dose amount is $1 \times 10^{15}$ cm$^{-2}$ is more than two times the fluorine atom concentration when the dose amount is $1 \times 10^{14}$ cm$^{-2}$. In FIG. 5, Tox means gate oxide layer thickness, and Jg means stress current density.

FIG. 5 will be explained in more detail below.

The present inventor noticed the function of F atoms to improve the reliability of oxide layer, based on the research finding that the distribution in wafer surface of Qbd of p-type polycrystalline silicon (p-Si) gate transistor obtained by implanting ions of boron difluoride (BF$_2$) is highly uniform.

In order to dope F atoms into the oxide layer, first F ions are implanted to the polycrystalline silicon layer deposited on the gate oxide layer as a gate electrode through the ion implantation method, and then the heat treatment is performed to diffuse the F atoms in the polycrystalline silicon layer into the gate oxide layer. This technique is simple, but is highly compatible with the currently-performed LSI processes. In FIG. 5, the relationship between the Qbd and the cumulative fraction defective ln(-ln(1-F)) is plotted (Weibull plots) with respect to an oxide layer in which no F atoms are doped, and oxide layers in which F atoms are doped to certain degrees. As shown in FIG. 5, when F atoms are dopeed into the gate oxide layer, the average Qbd values are not changed (degraded) from those of the oxide layer to which no F atoms are dopeed, but only the lowest (lip) portion in the distribution disappears. On the other hand, when excessive amount of F atoms are dopeed, the entire Qbd values are changed to smaller values. Thus, it can be understood that there is an optimum value for the dopeion amount of F atoms.

This experimental fact suggests that it is important as a technique to improve the reliability of devices that F atoms are dopeed into a gate oxide layer. At the same time, this experimental fact gives an important sign to the analysis of the reason why the electric reliability is improved by dopeing third atoms to a gate oxide layer besides Si atoms and O atoms.

Next, the gate electrode 5a and the gate dielectric film 4a in the MOS transistor region are formed by etching the polycrystalline silicon layer 5 and the oxide layer 4 through reactive ion etching utilizing a resist mask. After the resist mask is removed, diffusion layer regions 10 are formed by implanting the dose amount $5 \times 10^{14}$ cm$^{-2}$ of BF$_2$ ions at an acceleration voltage of 30 keV. Subsequently, a sidewall dielectric film 11 of silicon nitride having a thickness of, e.g., 10 nm, is formed at the sidewall portion of the gate section by the low-pressure chemical vapor deposition (LP-CVD) method (FIG. 2(e)).

Further, a heat treatment is performed on the workpiece in a nitrogen atmosphere at a temperature of e.g., 750–950° C. for 1–100 minutes so as to activate the dopant in the gate electrode and the dopant in the source and drain diffusion layers. Then, a silicon oxide layer 14 having a thickness of, e.g., 300 nm, is deposited on the entire surface through the chemical vapor deposition (CVD) method. Thereafter, contact holes 15 are formed through the silicon oxide layer 14 by anisotropy dry etching. Then, an aluminum layer containing, e.g., 0.5% each of silicon and copper, and having a thickness of 800 nm, is formed and patterned to make aluminum electrodes 16. Finally, the workpiece is heat treated in a nitrogen atmosphere containing 10% hydrogen at a temperature of 450° C. for 15 minutes (FIG. 2(f)).

Through the above-described process, a p-channel MOS transistor according to the second embodiment of the present invention is completed.

Figure 6:
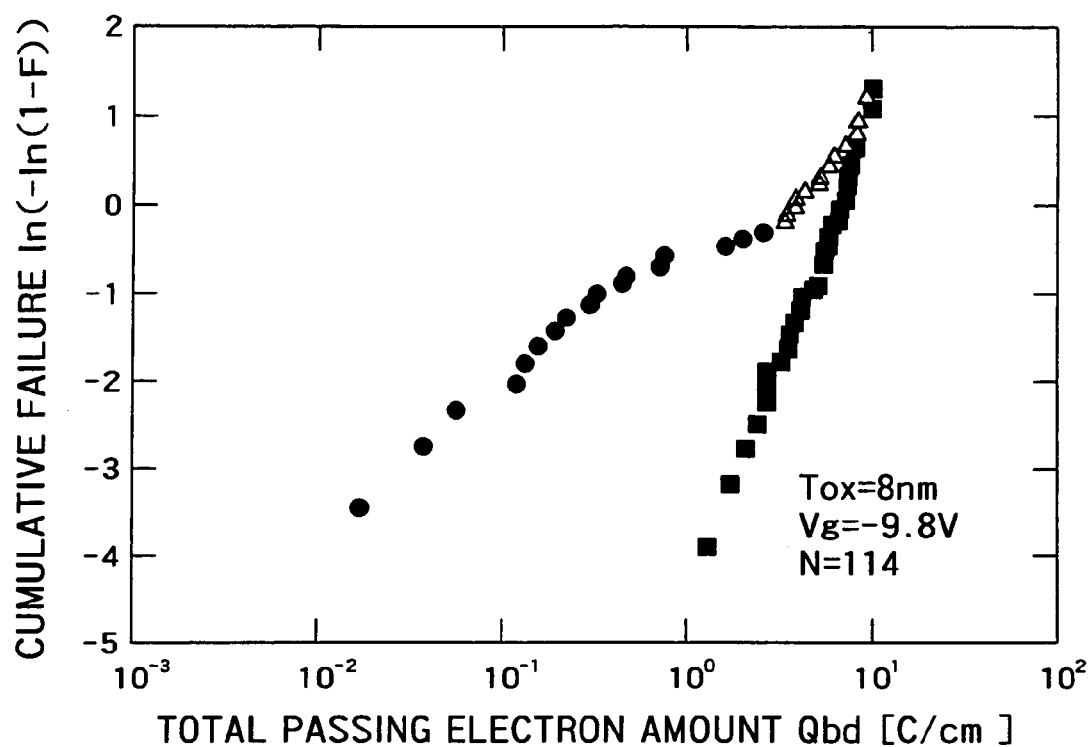
FIG. 6 shows the lifetime distribution of MOS capacitors manufactured according to the present invention.
Figure 7:
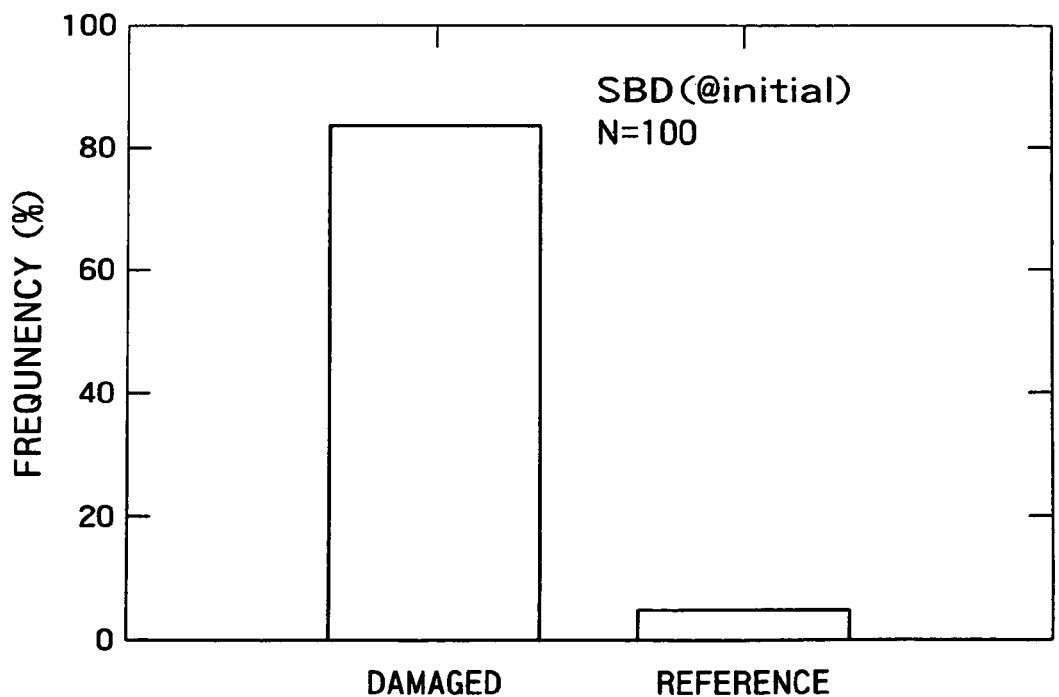
FIG. 7 shows the frequency of occurrence of initial soft breakdown of MOS capacitors manufactured according to the present invention.
Figure 8:
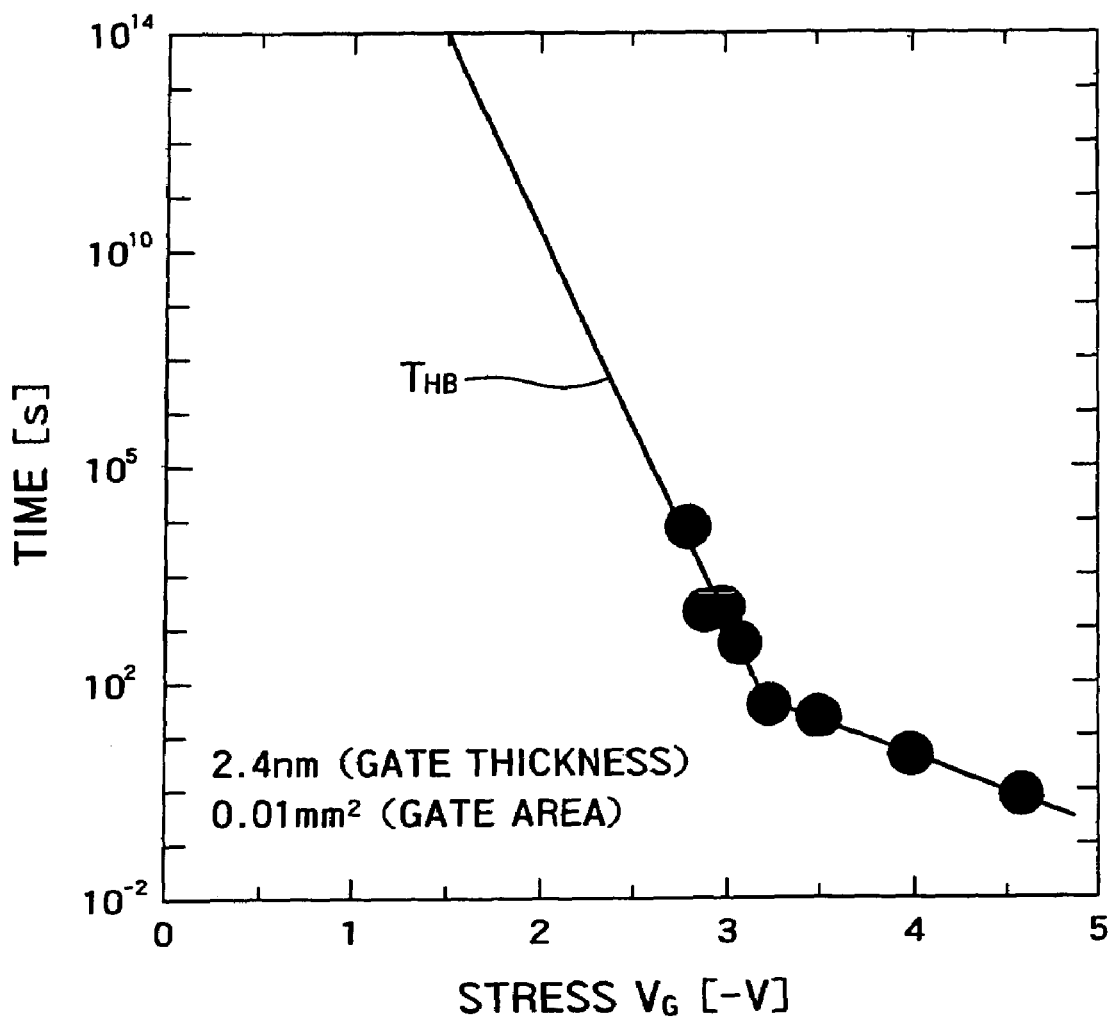
FIG. 8 shows that the hard breakdown lifetime of a MOS structure is lengthened if it first suffers a soft breakdown.

FIGS. 6 and 7 show the Weibull plot of the total amount Qbd of electrons in a MOS capacitor utilizing a gate dielectric film according to the embodiment of the present invention, and the initial failure frequency of such MOS capacitors, respectively. In FIGS. 6 and 7, Vg means gate voltage, N means sample number and SBD(@initial) means initial soft break down. That is, FIG. 6 shows the Weibull plot of the total amount Qbd of electrons passing through the gate oxide layer before the gate oxide layer reaches a dielectric breakdown state. The device area in this case is 0.1 mm$^2$. The vertical axis represents values corresponding to the cumulative fraction defective, and the horizontal axis represents Qbd. The black squares represent the experimental results of conventional devices where the impurity atom concentration in the gate dielectric film is not at random, all of these devices first suffering hard breakdown. The black circles represent the measurement results of devices first suffering soft breakdown, obtained by the method of this embodiment, and the white triangles represent the measurement results of devices first suffering hard breakdown, obtained by the method of this embodiment. As can be clearly understood from FIG. 6, when the method of this embodiment is used, the ratio of devices first suffering the soft breakdown increases. FIG. 7 shows the frequency of occurrence of device first suffering soft breakdown when current-voltage characteristic of a MOS capacitor, having a relatively large area of 1 mm$^2$, is measured. With respect to the devices obtained through the process of the present invention (marked "Damaged"), soft breakdown is observed for about 80% of the MOS capacitors. On the other hand, with respect to the devices obtained through the conventional process (marked "Reference"), soft breakdown is observed for only about 5% of the MOS capacitors. Thus, there is a clear difference between the two. It can be understood from FIGS. 6 and 7 that soft breakdown is caused very efficiently when the gate oxide layer of the present invention is used for a MOS capacitor.

Third Embodiment

Next, the third embodiment of the present invention will be described with reference to FIGS. 3(a) to 3(f). The third embodiment is a method of manufacturing a semiconductor device, and FIGS. 3(a) to 3(f) show the steps of manufacturing a p-channel MOS transistor of the semiconductor device.

First, an n-type silicon substrate 1 having, e.g., a surface orientation (100) and a specific resistance of 4–6 Ωcm is prepared. Device isolation regions 2a and 2b of about 0.6 μm in depth are formed in the n-type silicon substrate 1 near its surface by the normal shallow trench isolation (STI) method (FIG. 3(a)).

Next, the workpiece is subjected to a mixed gas containing oxygen gas and hydrogen gas at a temperature of, e.g., 750° C., in order to form an oxide layer 4 of, e.g., about 3–8 nm in thickness. A polycrystalline silicon layer 5 having a thickness of 200 nm, which serves as a gate electrode, is formed on the oxide layer 4 (FIG. 3(b)).

Then, projections and depressions are formed on the upper surface of the polycrystalline silicon layer 5 through, e.g., chemical dry etching method. In this manner, the effect of the fast etching speed at the grain boundary, and the facet on the (111) surface, which causes fluctuations, can be anticipated. Then, the dose amount $1 \times 10^{14}$ cm$^{-2}$ of fluorine ions 6 is implanted at an acceleration voltage of 10 keV, thereby implanting fluorine atoms to the polycrystalline silicon layer 5 (FIG. 3(c)). In stead of the above chemical dry etching method, wet etching may be used.

Then, the workpeice is subjected to nitride gas at a temperature of, e.g., 1,000° C. for 10 seconds, so that the fluorine atoms in the polycrystalline silicon layer 5 are diffused into the oxide layer 4. Since the fluorine atoms have not been evenly implanted to the polycrystalline silicon layer 5, the fluorine concentration distribution in a surface of the gate oxide layer 4 that is parallel to the surface of the silicon substrate 1 is irregular, as indicated by the dotted line (FIG. 3(d)).

Thereafter, the gate electrode 5a in the MOS transistor region is formed by etching the polycrystalline silicon layer through reactive ion etching utilizing a resist mask. After the resist mask is removed, diffusion layer regions 10 are formed by implanting the dose amount $5 \times 10^{14}$ cm$^{-2}$ of BF$_2$ ions 6 at an acceleration voltage of 20 keV. Subsequently, a sidewall dielectric film 11 of silicon nitride having a thickness of, e.g., nm, is formed at the sidewall portion of the gate section by the low-pressure chemical vapor deposition (LP-CVD) method. Then, the dose amount $3 \times 10^{14}$ cm$^{-2}$ of BF$_2$ ions 6 are implanted at an acceleration voltage of, e.g., 20 keV to form source and drain diffusion layers 13 (FIG. 3(e)).

Further, a heat treatment is performed on the workpiece in a nitrogen atmosphere at a temperature of e.g., 750–950° C. for 1–100 minutes so as to activate the dopant in the gate electrode and the dopant in the source and drain diffusion layers. Then, a silicon oxide layer 14 having a thickness of, e.g., 300 nm, is deposited on the entire surface trough the chemical vapor deposition (CVD) method. Thereafter, contact holes 15 are formed through the silicon oxide layer 14 by anisotropy dry etching. Then, an aluminum layer containing, e.g., 0.5% each of silicon and copper, and having a thickness of 800 nm, is formed and patterned to make aluminum electrodes 16. Finally, the workpiece is heat treated in a nitrogen atmosphere containing 10% hydrogen at a temperature of 450° C. for 15 minutes (FIG. 3(f)).

In this way, a p-channel MOS transistor according to the third embodiment of the present invention is completed.

Fourth Embodiment

FIGS. 4(a) to 4(f) are sectional views showing the steps of a method of manufacturing a p-channel MOS transistor according to the fourth embodiment of the present invention.

First, an n-type silicon substrate 1 having, e.g., a surface orientation (100) and a specific resistance of 4–6 Ωcm is prepared. Device isolation regions 2a and 2b of about 0.6 μm in depth are formed in the n-type silicon substrate 1 near its surface by the normal shallow trench isolation (STI) method (FIG. 4(a)).

Next, the workpiece is subjected to a mixed gas containing oxygen gas and hydrogen gas at a temperature of, e.g., 750° C. in order to form an oxide layer 4 of, e.g., about 3–8 nm in thickness. A polycrystalline silicon layer 5 having a thickness of 200 nm, which serves as a gate electrode, is formed on the oxide layer 4 (FIG. 4(b)).

Then, a resist is applied to the back surface of the silicon substrate 1. Subsequently, the workpiece is soaked in a 1% potassium hydroxide solution for, e.g., one minute so as to form projections and depressions on the upper surface of the polycrystalline silicon layer 5. After the resist is removed, the dose amount $1 \times 10^{14}$ cm$^{-2}$ of fluorine ions 6 are implanted at an acceleration voltage of 10 kev so as to implant fluorine atoms to the polycrystalline silicon layer 5 (FIG. 4(c)).

Then, the workpeice is subjected to nitride gas at a temperature of, e.g., 1,000° C. for 10 seconds, so that the fluorine atoms in the polycrystalline silicon layer 5 are diffused into the oxide layer 4. Since the fluorine atoms have not been evenly implanted to the polycrystalline silicon layer 5, the fluorine concentration distribution in a surface of the gate oxide layer 4 that is parallel to the surface of the silicon substrate 1 is irregular, as shown by the dotted line (FIG. 4(d)).

Thereafter, the gate electrode 5a and the gate oxide layer 4a in the MOS transistor region are formed by etching the polycrystalline silicon layer 5 and the oxide layer 4 through reactive ion etching utilizing a resist mask. After the resist mask is removed, diffusion layer regions 10 are formed by implanting the dose amount $5 \times 10^{14}$ cm$^{-2}$ of BF$_2$ ions 6 at an acceleration voltage of 20 keV. Subsequently, a side wall dielectric film 11 of silicon nitride having a thickness of, e.g., 10 nm is formed at the sidewall portion of the gate section by the low-pressure chemical vapor deposition (LP-CVD) method (FIG. 4(e)).

Further, a heat treatment is performed on the workpiece in a nitrogen atmosphere at a temperature of e.g., 750–950° C. for 1–100 minutes so as to activate the dopant in the gate electrode and the dopant in the source and drain diffusion layers. Then, a silicon oxide layer 14 having a thickness of, e.g., 300 nm, is deposited on the entire surface through the chemical vapor deposition (CVD) method. Thereafter, contact holes 15 are formed through the silicon oxide layer 14 by anisotropy dry etching. Then, an aluminum layer containing, e.g., 0.5% each of silicon and copper, and having a thickness of 800 nm, is formed and patterned to make aluminum electrodes 16. Finally, the workpiece is heat treated in a nitrogen atmosphere containing 10% hydrogen at a temperature of 450° C. for 15 minutes (FIG. 4(f)).

In this way, a p-channel MOS transistor according to the fourth embodiment of the present invention is completed.

Although a thermally-oxidized silicon layer is used as the gate dielectric film of the embodiments of the present invention, the material is not limited thereto. It is possible to use an oxide layer containing nitrogen, a nitride layer, or any other high-k material layer. Further, an oxide layer using oxygen activated by the use of microwaves or laser has the same effects as a thermally-oxidized layer. Moreover, the present invention can be applied to a device using the fluctuations caused by the breakdown phenomenon. The present invention can be modified further as long as the modification does not veer from the scope of the present invention.

As described above, according to the present invention, it is possible to prevent the dielectric breakdown of a gate dielectric film from proceeding from soft breakdown, thereby elongating the hard breakdown lifetime of the gate dielectric film. It is also possible to form a MOS transistor including such a gate dielectric film and having a high reliability with a relatively easy method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method of manufacturing a semiconductor device comprising:
forming an insulating layer on a semiconductor substrate of a first conductivity type;
forming a conductive layer on the insulating layer;
forming on the conductive layer a spotted layer including minute spots containing a resistive material resisting against ion implantation;
non-uniformly implanting impurity ions to the conductive layer via the spotted layer containing the resistive material; and diffusing the impurity ions in the conductive layer into the insulating layer.

2. The method of manufacturing a semiconductor device according to claim 1, wherein the impurity ions are selected from the group consisting of B, C, N, F, P, S, Cl, As, Se and Br.

3. The method of manufacturing a semiconductor device according to claim 1, wherein the resistive material is a resist.

4. The method of manufacturing a semiconductor device according to claim 2, wherein the spotted layer is formed by applying the resist to the conductive layer, and spottedly leaving the resist on the conductive layer by performing etch back of the resist.

5. The method of manufacturing a semiconductor device according to claim 1, further comprising:
forming a gate oxide layer from the insulating layer; and
forming a gate electrode from the conductive layer.

6. A method of manufacturing a semiconductor substrate comprising:
forming an insulating layer on a semiconductor substrate of a first conductivity type;
forming a conductive layer on the insulating layer;
forming minute concavity and convexity on a surface of the conductive layer by etching the conductive layer; performing ion implantation of impurity ions on the conductive layer having the concavity and convexity on the surface; and
diffusing the impurity ions in the conductive layer into the insulating layer.

7. The method of manufacturing a semiconductor substrate according to claim 6, wherein the etching is chemical dry etching.

8. The method of manufacturing a semiconductor substrate according to claim 6, wherein the etching is wet etching.

9. The method of manufacturing a semiconductor device according to claim 7, wherein said impurity ions are selected from the group consisting of B, C, N, F, P, S, Cl, As, Se and Br.

10. The method of manufacturing a semiconductor device according to claim 8, wherein said impurity ions are selected from the group consisting of B, C, N, F, P, S, Cl, As, Se and Br.

11. The method of manufacturing a semiconductor device according to claim 9, further comprising:
forming a gate oxide layer from the insulating layer; and
forming a gate electrode from the conductive layer.

12. The method of manufacturing a semiconductor device according to claim 10, further comprising:
forming a gate oxide layer from the insulating layer; and
forming a gate electrode from the conductive layer.

* * * * *